(12) United States Patent
Yamaguchi et al.

(10) Patent No.: US 7,653,169 B2
(45) Date of Patent: Jan. 26, 2010

(54) TIMING ADJUSTMENT FOR DATA TRANSMITTING/RECEIVING CIRCUIT

(75) Inventors: Hisakatsu Yamaguchi, Kawasaki (JP); Kouichi Kanda, Kawasaki (JP); Junji Ogawa, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 583 days.

(21) Appl. No.: 11/362,174

(22) Filed: Feb. 27, 2006

(65) Prior Publication Data

US 2007/0064781 A1    Mar. 22, 2007

(30) Foreign Application Priority Data

Sep. 16, 2005    (JP) ............... 2005-270984

(51) Int. Cl.
*H03D 3/24*    (2006.01)
(52) U.S. Cl. ............... 375/376; 375/326; 375/327; 375/373
(58) Field of Classification Search ................ 375/376, 375/326, 327, 373
See application file for complete search history.

(56) References Cited

U.S. PATENT DOCUMENTS 6,201,423 B1 * 3/2001 Taguchi et al. ............ 327/141
7,106,114 B2 * 9/2006 Taniguchi .................. 327/158
7,116,143 B2 * 10/2006 Deivasigamani et al. .... 327/149

FOREIGN PATENT DOCUMENTS

| EP | 0 642 238 A2 | 1/1994 |
|---|---|---|
| EP | 1 365 531 A1 | 5/2002 |
| JP | 05-219039 A | 8/1993 |
| JP | 08-130534 A | 5/1996 |
| JP | 10-112182 | 4/1998 |
| JP | 10-228449 | 8/1998 |
| JP | 2001-306176 | 11/2001 |
| JP | 2004-145999 | 5/2004 |

OTHER PUBLICATIONS

Hirotaka Tamura, et al,; "Synfinity II-High Speed Signal Transmission Technology"; vol. 50; No. 4; pp. 235-241 (Jul. 1999).

* cited by examiner

*Primary Examiner*—Ted M Wang
(74) *Attorney, Agent, or Firm*—Arent Fox LLP.

(57) ABSTRACT

In order to provide a timing adjustment circuit capable of transmitting/receiving data without being affected by process unevenness and power voltage/temperature fluctuations even at a high data transfer rate, the phase of data outputted by a data transmitting unit is compared with the phase of a clock for regulating a data receiving timing of a data receiving unit, and the phase of a clock for regulating a data transmitting timing of the data transmitting unit is adjusted according to the comparison result.

18 Claims, 13 Drawing Sheets

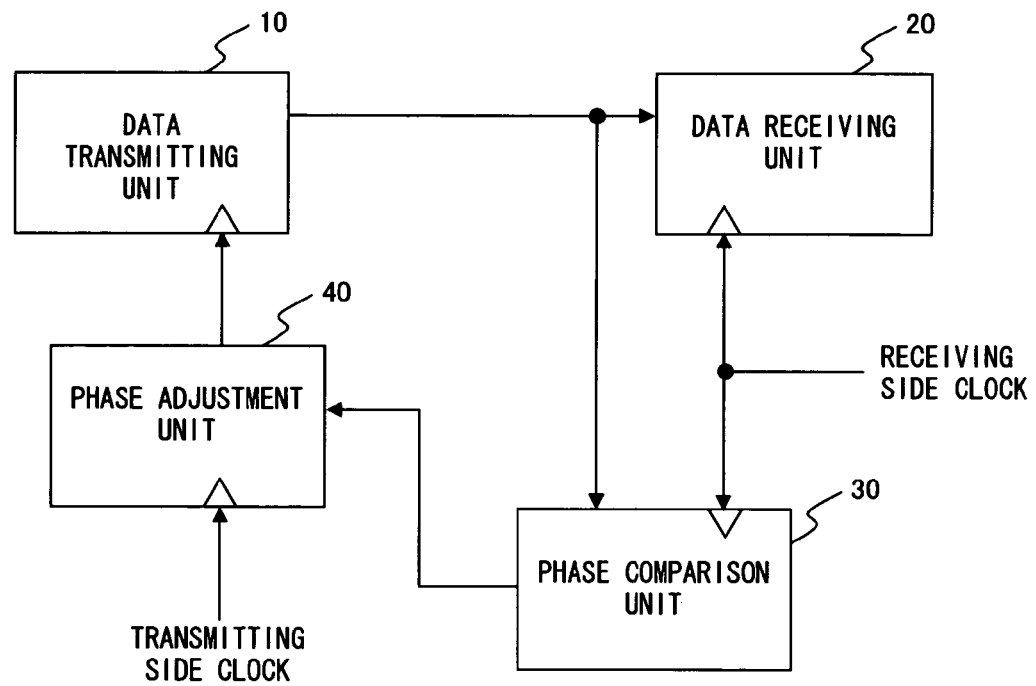
F I G. 5

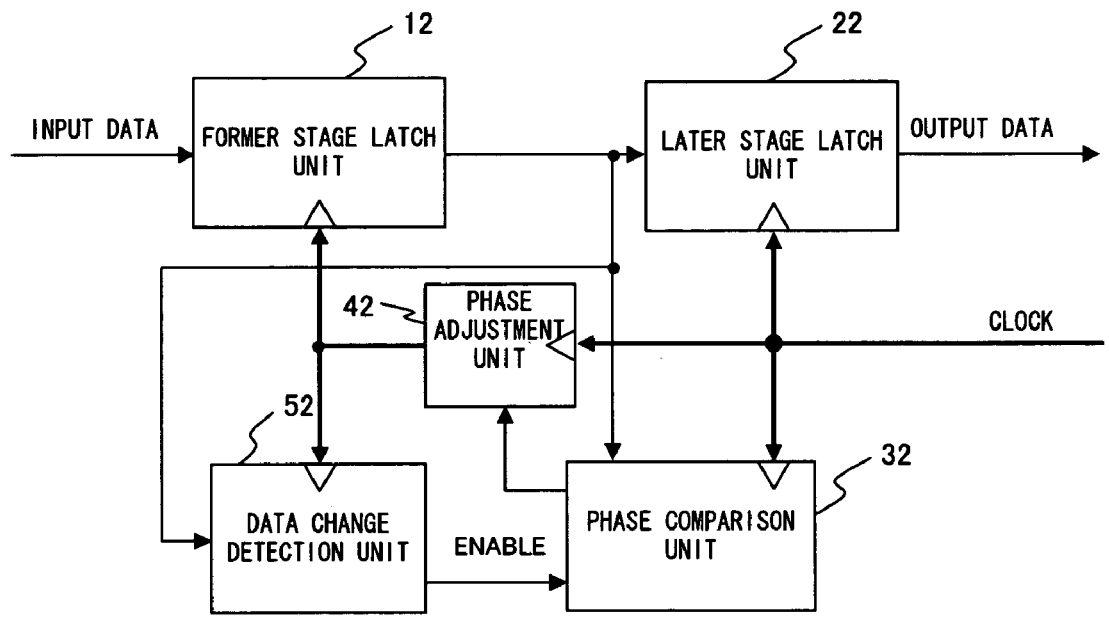
F I G. 6

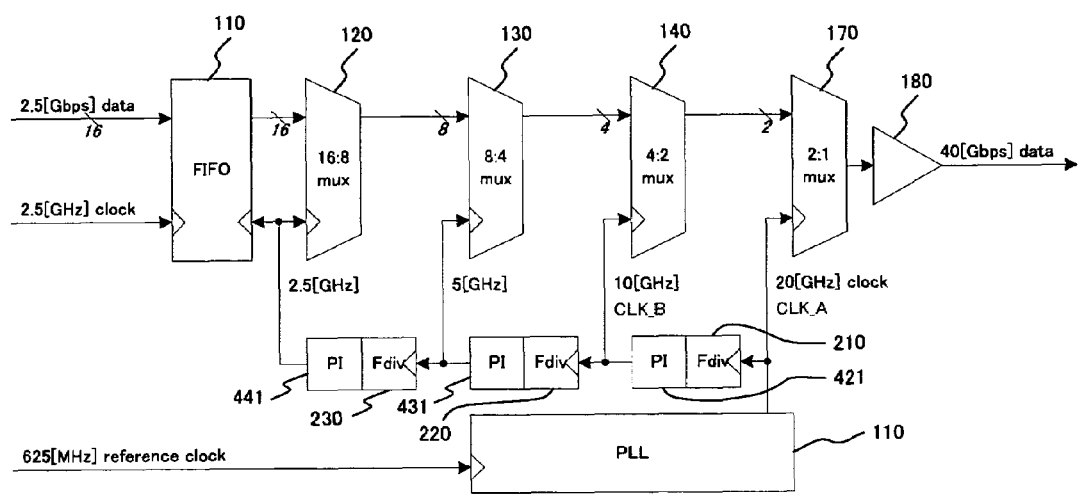
F I G. 1 3

TIMING ADJUSTMENT FOR DATA TRANSMITTING/RECEIVING CIRCUIT

CROSS-REFERENCE TO RELATED APPLICATIONS

This application is based upon and claims the benefit of priority from prior Japanese Patent Application No. 2005-270984 filed on Sep. 16, 2005, the entire contents of which are incorporated herein by reference.

BACKGROUND OF THE INVENTION

1. Field of the Invention

The present invention relates to a timing adjustment circuit for a data transmitting/receiving circuit for transmitting/receiving data between a data transmitting unit and a data receiving unit, between a plurality of devices and circuit blocks in an LSI, between an LSI, between boards and cabinets, and to an LSI and a data transmitting/receiving system with such a timing adjustment circuit, and more particularly relates to a timing adjustment circuit for adjusting the phase relationship between data and clock in such a way that data can be surely transmitted/received between multiplexers for sequentially converting data bit width gradually in a data transmitting circuit which gradually converts input parallel data into serial data, for example, converts input parallel data with bit width of 16 bits and speed of 2.5 Gbps into 8 bit 5 Gbps→4 bit 10 Gbps→2 bit 20 Gbps→1 bit 40 Gbps, using a clock obtained by dividing an internally generated clock.

2. Description of the Related Art

Recently, in computer and communication fields, the amount of information to be processed has increased. In order to cope with this increasing amount of information, data transmitting/receiving speed between LSIs has increased. A CMOS 10 Gbps transceiver was announced in 2002, although it is still under development. After that, attention is focused on the research of the CMOS 40 Gbps transceiver. More particularly, in an area requiring such a high data transfer rate, the most advanced technology is applied. For example, the CMOS 40 Gbps transceiver is being developed assuming a technology at a 0.1 µm or less level. However, in a data transmitting/receiving system requiring a high data transfer rate, an internal LSI clock frequency must be higher. To contrary to the functional improvement of a transistor accompanying fine semiconductor process, its process unevenness has remarkably increased. Conventionally, a timing margin for data reception has been secured by closely allocating blocks between which data is transmitted/received as much as possible by layout contrivance. However, such a method is close to its limit due to the improvement of a data transfer rate and the process unevenness.

FIG. 1 shows an example of the configuration of a data transmitting circuit being one example of the above-described high-speed transceiver. The data transmitting circuit shown in FIG. 1 gradually converts input parallel data into serial data, using a clock obtained by frequency dividers (210, 220 and 230) sequentially dividing a clock internally generated by a PLL (100) after parallel data with width of 16 bits and speed of 2.5 Gbps is once stored in a first-in first-out (FIFO) data buffer 110. Specifically, input data of 16 bit width and 2.5 Gbps is converted into data of 8 bit width and 5 Gbps by a 16:8 multiplexer (120), then is converted into data of 4 bit width and 10 Gbps by a 8:4 multiplexer (130), further is converted into data of 2 bit width and 20 Gbps by a 4:2 multiplexer (140) and is converted into serial data of by a 2:1 multiplexer (170) of 40 Gbps. Then, 40 Gbps data is externally outputted via a final stage buffer (180).

Next, data conversion by the multiplexers of the data transmitting circuit and data transmission/reception between the multiplexers, shown in FIG. 1 are described with reference to FIG. 2, using conversion between the 4:2 multiplexer (140) and the 2:1 multiplexer (170) as an example.

Four bits, DT_IN[0], DT_IN[1], DT_IN[2] and DT_IN[3] which are inputted from the former stage 8:4 multiplexer are received by the first stage latch circuits (141, 143, 151 and 153) of the 4:2 multiplexer (140) in synchronization with a 10 GHz clock CLK_B obtained by the frequency divider (210) for dividing into two a 20 GHz clock CLK_A supplied to the later stage 2:1 multiplexer (170).

Then DT_IN[0] and DT_IN[2] are supplied to a selector (146) via the latch circuit (142) and the latch circuits (144 and 145), respectively, and DT_IN[1] and DT_IN[3] are supplied to a selector (156) via the latch circuit (152) and the latch circuits (154 and 155), respectively.

The selectors (146 and 156) select DT_IN[0] and DT_IN[1], respectively, when the clock CLK_B rises up and select DT_IN[2] and DT_IN[3], respectively, when the clock CLK_B falls down. Therefore, as the output DT of the selector (146), two pieces of serial data, DT_IN[0] and DT_IN[2], of speed twice as high as 10 GHz can be obtained. For the output DTX of the selector (156), an analogous output can be obtained.

DT and DTX, being the outputs of the 4:2 multiplexer (140) are received by latch circuits (171 and 173) of the 2:1 multiplexer (170) in synchronization with the 20 GHz clock CLK_A, are supplied to a selector (176) via a latch circuit (172) and latch circuits (174 and 175), are selected in the selector (176) in synchronization with the rising-up and falling-down, respectively of the clock CLK_A and are outputted as the output signals DT_OUT of a transmitting circuit.

FIG. 3 is a timing chart in the case where data is normally transmitted/received between the 4:2 multiplexer (140) and the 2:1 multiplexer (170) shown in FIG. 2.

The clock CLK_A regulates the data receiving timing of the later stage 2:1 multiplexer. The clock CLK_B regulates the data output timing of the former stage 4:2 multiplexer, and is a divided clock synchronous with the rising-up edge of the clock CLK_A. When the clock CLK_B synchronous with the rising-up of the clock CLK_A rises up, data is outputted from the 4:2 multiplexer (140). The 2:1 multiplexer (170) receives this data when the clock CLK_A rises up in a subsequent cycle. In design, this timing chart must be realized under conditions in consideration of process unevenness and power voltage/temperature fluctuations. In the case of the prior art, the timing chart shown in FIG. 3 is realized by shortening the physical distance between multiplexers and also devising the circuit configurations of a multiplexer and a frequency divider.

However, in the example of a high-speed transmitting circuit for finally outputting data of 40 Gbps speed shown in FIG. 1, it is becoming difficult to surely transmit/receive data between multiplexers. FIG. 4 is a timing chart in the case where data is not normally transmitted/received between multiplexers. As shown in FIG. 4, if there is the displacement of received data in the rising-up timing of the clock CLK_A as shown in FIG. 4, the first stage latch circuits (171 and 173) of the 2:1 multiplexer (170) can neither correctly latch data nor the 2:1 multiplexer (170) can correctly receive it.

The prior art of the data transmission/reception between LSIs or the like are disclosed by the following patent references 1-3 and non-patent reference 1. The prior art disclosed by patent references 1 and 2 is one obtained by applying a circuit technology generally called Delay-Locked Loop (DLL). The phase relationship between output data and an output clock is adjusted by a data transmitting circuit in such a way that data can be surely received by a data receiving circuit. However, if a transfer distance increases or a transfer rate increases, it becomes difficult for the data receiving circuit to surely receive data, due to process unevenness and power voltage/temperature fluctuations.

The data transmitting/receiving technology disclosed by patent reference 3 and non-patent reference 1 adjust the phase of a clock for regulating the data receiving timing of the data receiving circuit for output data from the data transmitting circuit. Therefore, if only data reception is considered, data can be surely received by the data receiving circuit. However, if the speed of a clock frequency becomes high, it is not preferable to adjust a clock on the receiving side when taking into consideration the process of the data receiving circuit after receiving data and the accuracy of the multiplexer output of the transmitting circuit shown in FIG. 10.

Patent reference 1: Japanese Published Patent Application No. H10-112182

Patent reference 2: Japanese Published Patent Application No. 2004-145999

Patent reference 3: Japanese Published Patent Application No. H10-228449

Non-patent reference 1: Yasutaka Tamura and Kotaro Goto, "High-speed Signal Transmission Technology: Synfinity II", Fujitsu, vol. 50, No. 4 pp. 235-241 (July 1999).

SUMMARY OF THE INVENTION

It is an object of the present invention to provide a timing adjustment circuit for realizing data transmission/reception which is not affected by process unevenness and power voltage/temperature fluctuations even at a high data transfer rate, and an LSI and a data transmitting/receiving system, with such a timing adjustment circuit.

The timing adjustment circuit of the present invention compares the phase of data outputted by a data transmitting unit with the phase of a clock for regulating the data receiving timing of a data receiving unit, and according to the comparison result, the data transmitting unit adjusts the phase of a clock for regulating the data transmitting timing of the data transmitting unit.

In the LSI of the present invention, data is transmitted/received between a plurality of blocks, and the LSI comprises a timing adjustment circuit comprising a data change detection unit for detecting the change of data outputted by a data transmitting side block for each block that becomes a transmitting side and for each block that becomes a receiving side, a phase comparison unit for comparing the phase of a clock for regulating the data receiving timing of the data receiving block side block with the phase of data outputted by the data transmitting side block, and a phase adjustment unit for changing the phase of a clock for regulating the data transmitting timing of the data transmitting side block, according to the phase comparison result of the phase comparison unit.

Furthermore, the data transmitting/receiving system between LSIs of the present invention comprises a timing adjustment circuit with a data change detection unit for detecting the change of data outputted by a first LSI, a phase comparison unit for comparing the phase of a clock for regulating the data receiving timing of a second LSI with the phase of data outputted by the first LSI, and a phase adjustment unit for changing the phase of a clock for regulating the data transmitting timing of the first LSI, according to the phase comparison result of the phase comparison unit.

According to the present invention, at a high data transfer rate, data can be surely transmitted/received between circuit blocks for transmitting/receiving data, without being affected by process unevenness and power voltage/temperature fluctuations.

BRIEF DESCRIPTION OF THE DRAWINGS

FIG. 5 shows the basic configuration of the present invention.

FIG. 6 shows an application example of the basic configuration of the present invention shown in FIG. 5.

FIG. 13 shows the configuration of the fourth preferred embodiment of the present invention.

DESCRIPTION OF THE PREFERRED EMBODIMENTS

Figure 1:
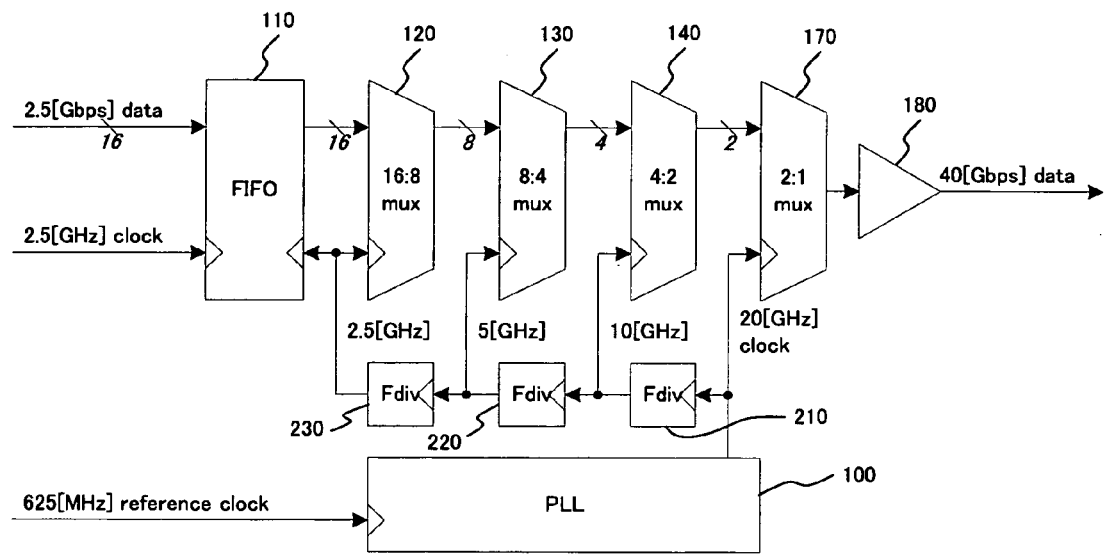
FIG. 1 shows an example of the conventional data transmitting circuit.

FIG. 5 shows the basic configuration of the present invention. In the present invention, the phase comparison unit (30) compares the phase of data transmitted from the data transmitting unit (10) to the data receiving unit (20) with the phase of a receiving side clock for regulating the data receiving timing of the data receiving unit (20). Then, the phase adjustment unit (40) adjusts the phase of a transmitting side clock for regulating the data transmitting timing of the data transmitting unit (10), according to the comparison result of the phase comparison unit (30) and supplies the phase adjusted clock to the data transmitting unit (10).

FIG. 6 shows an application example of the basic configuration of the present invention shown in FIG. 5. In FIG. 6, data inputted to the former stage latch unit (12) corresponding to the data transmitting unit (10) in FIG. 5 is outputted as output data via the later stage latch unit (22) corresponding to the data receiving unit (20) in FIG. 5. In this case, the phase of a clock for regulating the data receiving timing of the later stage latch unit (22) is adjusted and is supplied as a clock for regulating the data output timing of the former stage latch unit (12). Then, a data change detection unit (52) for detecting a timing the value of data outputted by the former latch unit (12) changes from "0" to "1" or from "1" to "0", is provided. When detecting the data change, the data change detection unit (52) transmits an enable signal to the phase comparison unit (32).

Upon receipt of the enable signal, the phase comparison unit (32) compares the phase of the output data of the former stage latch unit (12) with the phase of a clock for regulating the data receiving timing of the later stage latch unit (22), and the phase adjustment unit (42) adjusts the phase of a clock for regulating the data output timing of the former stage latch unit (12), according to the comparison result.

By providing a replica with the same configuration as the former stage, for outputting data which always changes on the former latch unit (12) side, instead of providing the data change detection unit (52) and the output data of the former stage latch unit (12), the replica' output can be given to the phase comparison unit (32).

As clear when comparing FIG. 6 with FIG. 5, the phase comparison unit (32) and the data change detection unit (52) in FIG. 6 or the phase comparison unit for comparing the phase of the output of the replica provided on the former stage latch unit (12) side which may be provided instead of the data change detection unit (52) with the phase of a clock for regulating the data receiving timing of the later stage latch unit (22) corresponds to the phase comparison unit (30) in FIG. 5.

According to the configuration in FIG. 5 or 6, the present invention can realize a data transmitting/receiving system which is not affected by process unevenness and power voltage/temperature fluctuations regardless of a data transfer rate. If the configuration in FIG. 6 is applied to the transmitting circuit in FIG. 1, for example, a 4:2 multiplexer (140) and 2:1 multiplexer (170) correspond to the former stage latch unit (12) and the later stage latch unit (22), respectively. In the data transmitting/receiving system for transmitting/receiving data, the present invention compares the phase of data outputted by the data transmitting block corresponding to the former stage latch unit (12) with the phase of a clock of the data receiving block corresponding to the later stage latch unit (22), and changes a clock for the former stage latch unit (12) in such a way that the later stage latch unit (22) can surely receive data outputted by the former stage latch unit (12), according to the comparison result.

Figure 2:
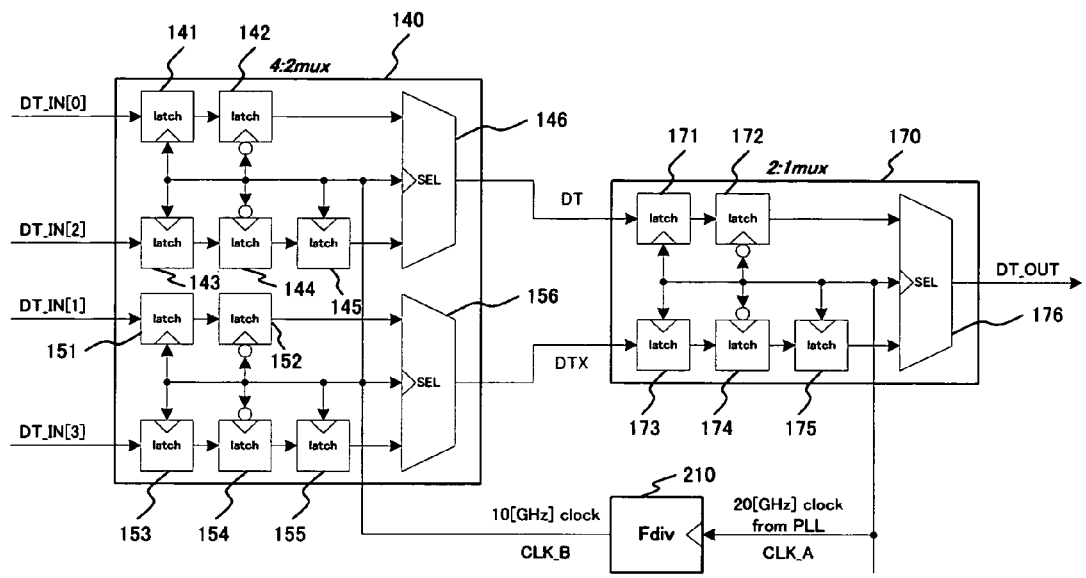
FIG. 2 explains the data transmission/reception between the multiplexers of the data transmitting circuit shown in FIG. 1.
Figure 3:
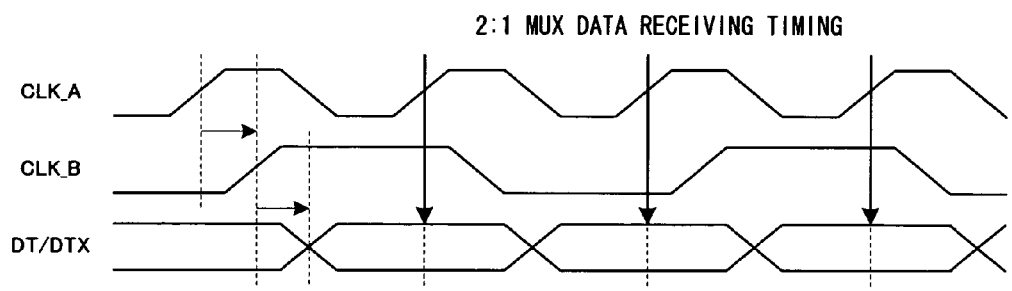
FIG. 3 is a timing chart in the case where data is normally transmitted/received between the multiplexers in FIG. 2.
Figure 4:
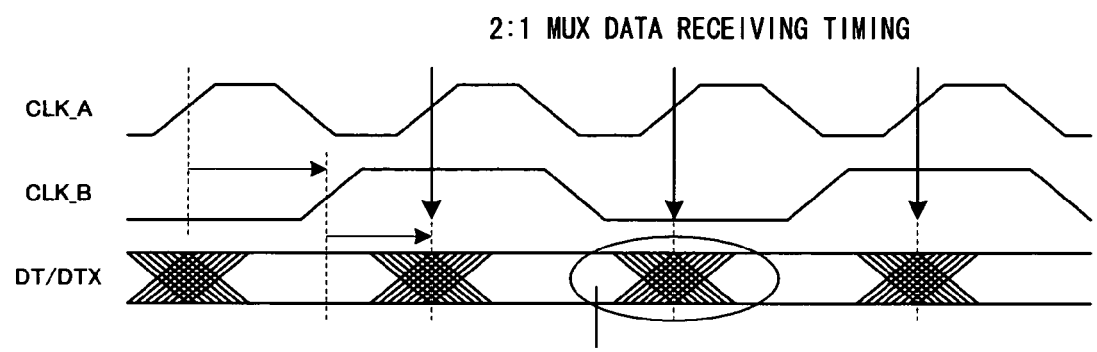
FIG. 4 is a timing chart in the case where data is not normally transmitted/received between the multiplexers in FIG. 2.

The data transmitting circuit with the data change detection unit (52) as a timing adjustment circuit for data transmission/reception between the 4:2 multiplexer (140) and 2:1 multiplexer (170) in FIG. 2 and that with a replica for outputting data which always changes as the timing adjustment circuit are called as the first and second preferred embodiments, respectively, of the present invention, which are described in detail below.

Firstly, the first preferred embodiment of the present invention is described with reference to FIGS. 7, 8 and 9.

Figure 7:
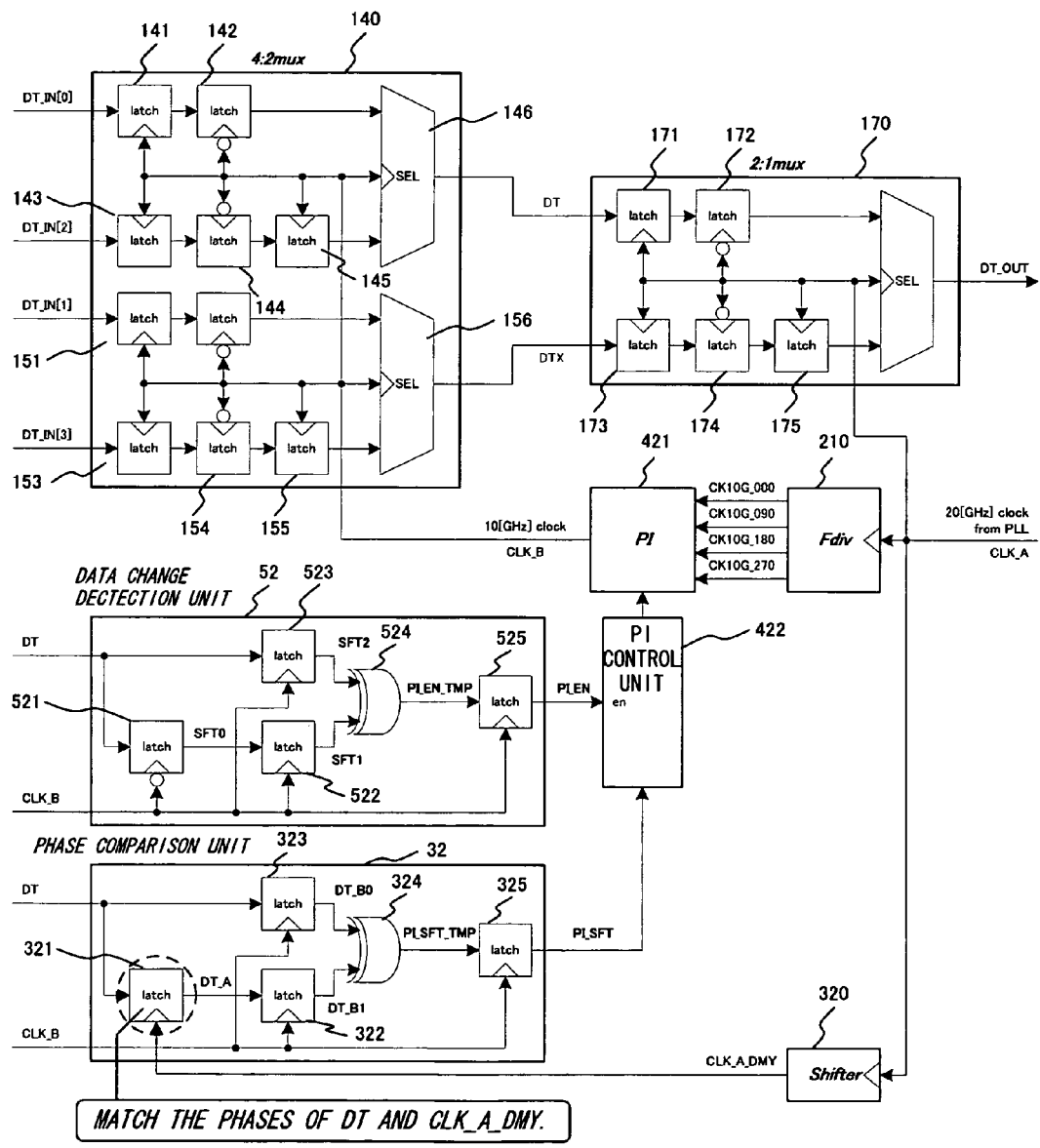
FIG. 7 shows the configuration of the first preferred embodiment of the present invention.

FIG. 7 shows the detailed configuration of the first preferred embodiment of the present invention. Components with the same reference numerals as in FIG. 2 are the same as described in FIG. 2. The configurations of the change detection unit (52) and phase comparison unit (32) are the same as those of the change detection unit (52) and phase comparison unit (32) for application example shown in FIG. 6, and a phase interpolator (PI)(421) with a function to change the phase of the clock of the 4:2 multiplexer (140) and a PI control unit (422) correspond to the phase adjustment unit (42) in FIG. 6.

The outline of operation of the configuration example shown in FIG. 7 is described below.

A 20 GHz clock CLK_A supplied from a phase-locked loop (PLL), which is not shown in FIG. 7, is distributed to a frequency divider (210), the 2:1 multiplexer (170) and a phase shifter (320).

The frequency divider (210) divides the clock CLK_A to supply clocks each of whose frequency is 10 GHz and whose phase difference is 0, 90, 180 and 270 degrees each to the PI (421). The PI (420) supplies a clock CLK_B whose phase is adjusted under the control of the PI control unit (422) to the 4:2 multiplexer (140).

The data change detection unit (52) outputs a data change detection signal PI_EN to the PI control unit (422). The PI control unit (422) validates the PI (421) with a function to change the phase of clock CLK_B to the 4:2 multiplexer (140) only while the data change detection signal PI_EN is high. Although in this preferred embodiment, the PI (421) is adopted as a means for changing the phase of a clock, the means is not limited to this. For example, by connecting clock buffers in series and adjusting its output terminal, instead of using the PI (421), the phase of a clock can also be changed. This also applies to its other preferred embodiments.

The phase shifter (320) supplies the latch circuit (321) of the phase comparison unit (32) with a clock CLK_A_DMY obtained by a fixed amount phase shift of the clock CLK_A.

In this preferred embodiment, the clock phases are compared by detecting the change of data. This is because the data change reflects the phase of a clock to the 4:2 multiplexer (140). The data change can be detected by calculating the Exclusive OR of the outputs of the latch circuits (522 and 523) as to continuous data outputted by the 4:2 multiplexer (140) by the XOR logic circuit (524) of the data change detection unit (52).

Figure 8:
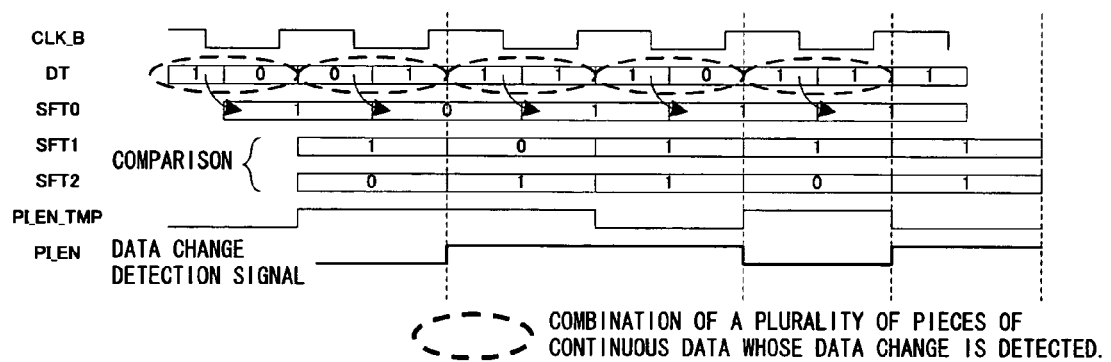
FIG. 8 is the timing chart of the data change detection in the first preferred embodiment.

FIG. 8 is the timing chart of this data change detection.

The data change detection unit (52) extracts the output of the 4:2 multiplexer (140) by two bits, in synchronization with clock CLK_B and detects whether data changes.

As shown in FIG. 8, when clock CLK_B falls down, a latch circuit (521) latches output data DT"1" to make its output SFT0 "1". When a subsequent clock CLK_B rises up, a latch circuit (523) latches the second bit DT"0" and also the latch circuit (522) latches the first bit data SFT0. Then, the XOR logic circuit (524) calculates the Exclusive OR of the output SFT1 of the latch circuit (522) and the output SFT2 of the latch circuit (523) and outputs it as a PI_EN_TMP signal. Then, a latch circuit (525) delays it by one clock to input it to the PI control unit (422) as a PI_EN signal. Then, the same process is applied to the third and fourth bits, and consecutive pair of bits of output data in order to generate PI_EN signals.

Next, the operation of the phase comparison unit (32) is described.

The output data DT of the 4:2 multiplexer (140) and the clock CLK_A_DMY obtained by shifting the phase of clock CLK_A to the 2:1 multiplexer (170) by a phase shifter (320) are compared. The phase of clock CLK_B for outputting the output data DT is adjusted in such a way that the change timing of the output data DT may coincide with the change timing of the CLK_A_DMY. In this case, if the change timing of the output data DT is compared with the change timing of the CLK_A instead of the CLK_A_DMY for adjustment of phase of clock CLK_B, the rising-up edge of the clock CLK_A is positioned in the change timing of the output data DT. In this state, the 2:1 multiplexer (170) cannot surely receive the output data of the 4:2 multiplexer (140). For this reason, in the phase comparison, the clock CLK_A_DMY obtained by shifting the phase of the clock CLK_A by a specific amount (applying phase offset) must be used. It is also necessary that the physical configuration of the latch circuit (321) for receiving the output data DT in the rising-up edge of the clock CLK_A_DMY is the same as that of the first stage latch circuits (171 and 173) of the 2:1 multiplexer (170).

In the phase comparison, whether the phase of the clock CLK_A_DMY is behind or in advance of the phase of the output data DT is determined by which data of the continuous two bit data outputted by the 4:2 multiplexer (140) is received at the rising-up edge of the clock CLK_A_DMY. FIG. 9 is the timing chart of this phase comparison.

Figure 9:
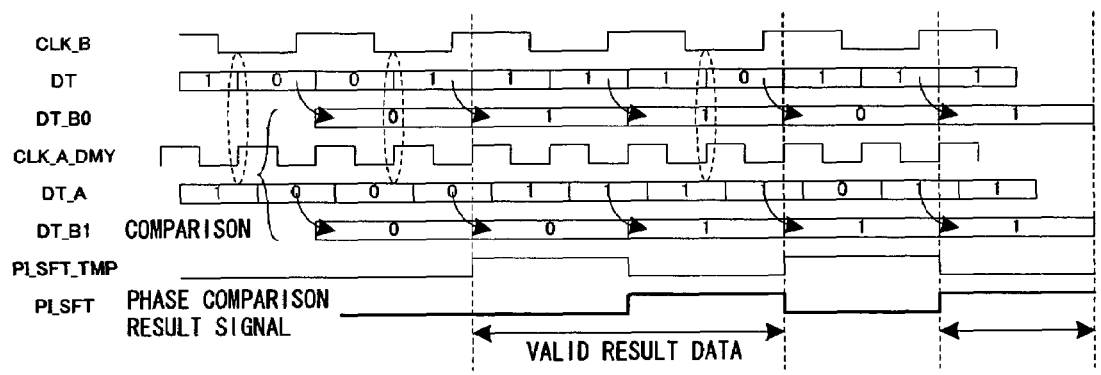
FIG. 9 is the timing chart of the phase comparison in the first preferred embodiment.

As shown in FIG. 9, clock CLK_B latches the later half bit of two bits of output data DT shown in FIG. 8 in the latch circuit (323) and the latch circuit (323) latches the second bit output data DT"0" when the clock CLK_B rises up to make its output DT_B0 "0". The value of the output data DT latched by the latch circuit (321) when clock CLK_A_DMY rises up is also "0", the second bit output data DT. When clock CLK_B rises up, the latch circuit (322) latches the output of DT_A of the latch circuit (321). The XOR logic circuit (324) calculates the Exclusive OR of the output DT_B0 and the output DT_B1 of the latch circuit (322) to generate output PI_SFT_TMP. The latch circuit (325) delays the output PI_SFT_TMP by one clock and inputs it to the PI control unit (422) as a phase comparison result signal PI_SFT. At this moment, the value of the phase comparison result signal PI_SFT is "0", which tentatively indicates that the data latched by clock CLK_A_DMY is the later half bit. Although the same process is consecutively applied, in the case of the third and fourth bit output data DT, as shown in FIG. 9, the output data DT latched by the latch circuit (321) when clock CLK_A_DMY rises up, is the third bit data, that is, the former half data of two bits of output data, and the value of the phase comparison signal PI_SFT becomes "1".

As described above, in this timing chart, when clock CLK_A_DMY receives advanced data, a phase comparison signal PI_SFT=1 is outputted as a result of the phase comparison. In this case, the PI control unit (422) is instructed to advance the phase of clock CLK_B. Conversely, if clock CLK_A_DMY receives delayed data, a phase comparison signal PI_SFT=0 is outputted. In this case, the PI control unit (422) is instructed to delay the phase of clock CLK_B.

In the PI control unit (422), even if the value of the phase comparison signal PI_SFT is "0", whether the output data DT latched by the latch circuit (321) when clock CLK_A_DMY rises up is the former or later half cannot be discriminated if the continuous data does not change, as described with reference to FIG. 8. Therefore, the phase comparison result signal is made valid only for continuous data whose change the data change detection unit (52) detects, and a control signal is supplied to the PI (421) to adjust the phase of clock CLK_B, for example, by integrating valid phase comparison result signals.

By repeating the above-described series of operations, the respective phases of output data DT and clock CLK_A_DMY can be matched, and the 2:1 multiplexer (170) can surely receive the output data of the 4:2 multiplexer (140). According to this preferred embodiment, a data transmitting/receiving system which is not affected by process unevenness and power voltage and temperature fluctuations, regardless of a data transfer rate, can be realized.

Next, the second preferred embodiment of the present invention is described with reference to FIGS. 10 and 11.

As described earlier, this preferred embodiment comprises a replica for outputting data which always changes. FIG. 10 shows the detailed configuration of this preferred embodiment, and FIG. 11 is the timing chart of phase comparison in this preferred embodiment.

Figure 10:
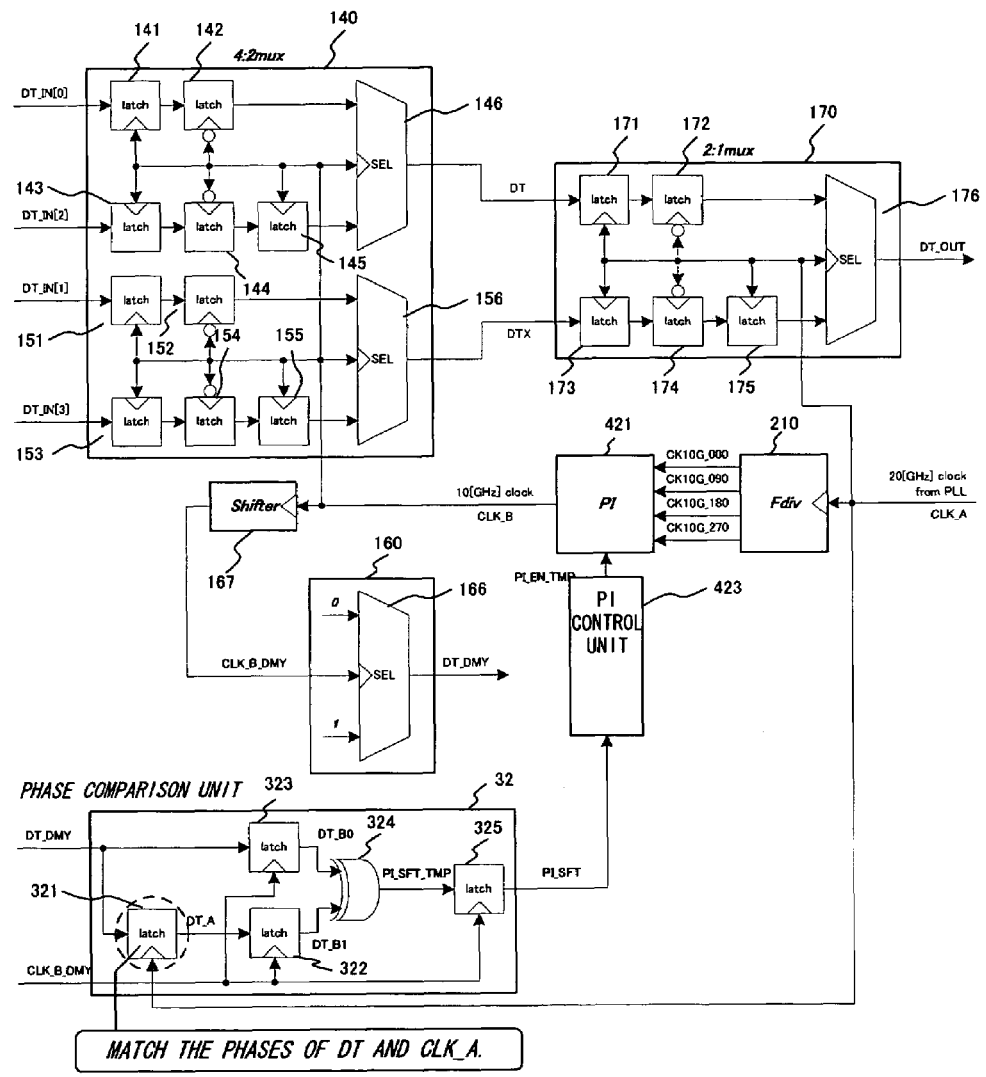
FIG. 10 shows the configuration of the second preferred embodiment of the present invention.

The components shown in FIG. 10, to which the same reference numerals as in FIG. 7 are attached have the same functions as those shown in FIG. 7, although the input data of the phase comparison unit (32) and the clocks of the phase comparison unit (32) in FIG. 10 differ from those in FIG. 7. As shown in FIG. 10, this preferred embodiment comprises a dummy data output unit (160) which is a block for generating "1010" repetition data, using a selector (166) with the same physical configuration as the final stage selectors (146 and 156) of the 4:2 multiplexer, instead of using the data change detection unit (52) shown in FIG. 7. This "1010" repetition data runs together with the output data of the 4:2 multiplexer (140). The dummy data output unit (160) is actually provided within the 4:2 multiplexer (140) like the selectors (146 and 156), which is not shown so in FIG. 10.

The reason that the physical configuration of the selector (166) is made the same as that of the final stage selectors (146 and 156) of the 4:2 multiplexer (140) is in order to accurately imitate the change timing of the output data of the final stage selectors (146 and 156), which is the essential output data of the 4:2 multiplexer (140).

Therefore, generally a circuit with the same physical configuration as the final stage circuit of the data transmitting unit, which is not limited to a selector, is used as the dummy output unit.

Since in the case of "1010" repetition data, data always changes, there is no need to detect a data change. Phases are compared between this "1010" repetition data DT_DMY and the clock CLK_A to the 2:1 multiplexer (170). While in the first preferred embodiment shown in FIG. 7, clock CLK_A_DMY obtained by shifting the phase of clock CLK_A by a fixed amount is used, in this preferred embodiment, clock CLK_B_DMY obtained by shifting the phase of clock CLK_B by a fixed amount is used, instead of clock CLK_A_DMY. The reason why the phase shifter (167) is used is the same as that why the phase shifter (320) is used, and the phase shifters (167 and 320) can be replaced with each other.

The phase comparison operation of this preferred embodiment is described below with reference to FIG. 11.

Figure 11:
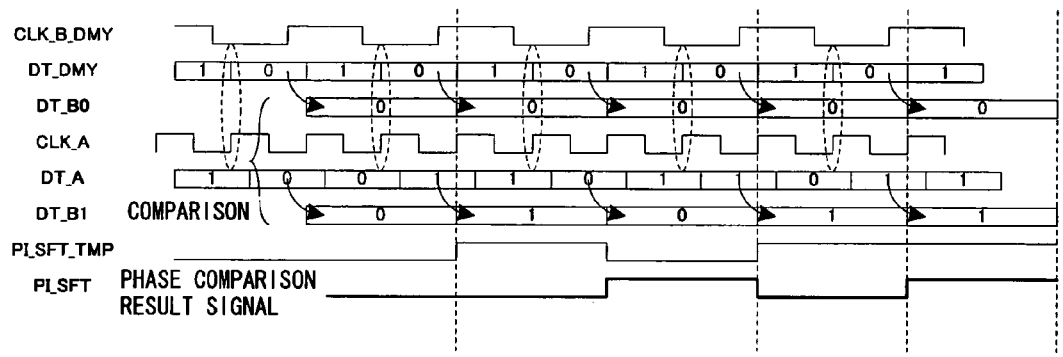
FIG. 11 is the timing chart of the phase comparison in the second preferred embodiment.

As shown in FIG. 11, when clock CLK_B_DMY rises up, the latch circuit (323) latched the data "0 of the "1010" repetition data DT_DMY. At the rising-up edge of the clock CLK_A, the latch circuit (321) latches the "1010" repetition data DT_DMY. The latch circuit (322) latches its output DT_A when clock CLK_B_DMY rises up. Then, the XOR logic circuit (324) compares the output DT_B1 of the latch circuit (322) with the output DT_B0 of the latch circuit (323) to generate a signal PI_SFT_TMP for indicating their coincidence/non-coincidence. Then, the signal PI_SFT_TMP is delayed by one clock by the latch circuit (325) and is inputted to the PI control unit (423) as a phase comparison result signal PI_SFT. Since in the "1010" repetition data DT_DMY, data always changes, the PI control unit (423) is configured as if the PI_EN_TMP signal shown in FIG. 7 were always inputted. The PI (421) adjusts the phase of clock CLK_B to the 4:2 multiplexer (140) by a control signal according to this phase comparison result.

According to this preferred embodiment, since a data change detection block can be omitted, a data transmitting/receiving system which is not affected by process unevenness and power voltage/temperature fluctuations regardless of a data transfer rate can be realized on a smaller circuit scale.

Figure 12:
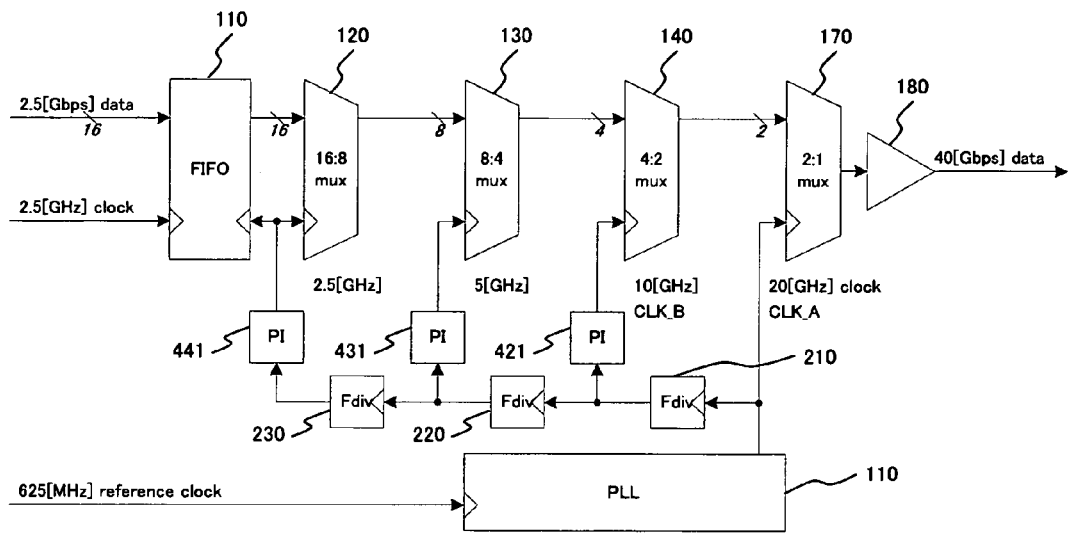
FIG. 12 shows the configuration of the third preferred embodiment of the present invention.

FIGS. 12 and 13 shows the respective configurations of the third and fourth preferred embodiments obtained by applying the timing adjustment circuit for transmitting/receiving data between the 4:2 multiplexer (140) and the 2:1 multiplexer (170) of the first and second preferred embodiments, respectively, to between the multiplexers of the data transmitting circuit shown in FIG. 1. Here, their mechanisms for phase comparison are omitted.

The third preferred embodiment shown in FIG. 12 differs from the fourth preferred embodiment shown in FIG. 13 in how to dispose PIs (421, 431 and 441).

In the third preferred embodiment shown in FIG. 12, the PIs are disposed in such a way as to individually adjust the phase of a clock to each multiplexer. Therefore, no influence of the change in a clock phase spreads to a previous stage multiplexer.

For example, if the phase of 10 GHz clock being the output of the PI (421) to the 4:2 multiplexer (140) is changed so that data can be surely transmitted/received between the 4:2 multiplexer (140) and the 2:1 multiplexer (170), the phase relationship between data and a clock between the 8:4 multiplexer (130) at its previous stage and the 4:2 multiplexer (140) changes. Therefore, the respective output phases of PIs (431) and (441) must be sequentially adjusted.

However, in the fourth preferred embodiment shown in FIG. 13, as shown in FIG. 13, the PIs are disposed in such a way that the output of a PI can be supplied to a previous stage frequency divider. If the phase of 10 GHz clock being the output of the PI (421) is changed so that data can be surely transmitted/received between the 4:2 multiplexer (140) and the 2:1 multiplexer (170), the phase relationship between data and a clock between its previous stage 8:4 multiplexer (130) and the 4:2 multiplexer (140) is maintained. This is because a clock to the previous stage 8:4 multiplexer (130) is generated based on a clock to the 4:2 multiplexer (140).

According to the third and fourth preferred embodiments, the present invention can be applied to the entire data transmitting circuit. More particularly, in the fourth preferred embodiment shown in FIG. 13, since the phase adjustment result does not spread to between other blocks, an easily usable data transmitting/receiving system can be provided.

The present invention is also applicable to data transmission/reception between LSIs. With the promotion of a fine semiconductor process, the influence of its process unevenness has increased. A circuit technology capable of coping with process unevenness, such as the timing adjustment circuit of the present invention will become an important element technology for realizing LSIs in the future.

What is claimed is:

1. A timing adjustment circuit for adjusting a data transmitting/receiving timing between a data transmitting unit for transmitting data and a data receiving unit for receiving data, comprising:
   a data change detection unit to detect a change of data outputted by the data transmitting unit;
   a phase comparison unit to compare a phase of data outputted by the data transmitting unit with a phase of a clock for regulating a data receiving timing of the data receiving unit, and
   a phase adjustment unit to adjust a phase of a clock for regulating a data transmitting timing of the data transmitting unit according to a phase comparison result containing from the phase comparison unit when the data change detection unit detects a change of data outputted by the data transmitting unit.

2. The timing adjustment circuit according to claim 1, wherein
   the phase comparison unit comprises a latch circuit as a first stage circuit which receives data outputted by the data transmitting unit, based on a clock for regulating a data receiving timing of the data receiving unit, and has the same configuration as a first stage circuit of the data receiving unit.

3. The timing adjustment circuit according to claim 2, wherein
   the latch circuit receives data outputted by the data transmitting unit in synchronization with a clock obtained by shifting a phase of a clock for regulating a data receiving timing of the data receiving unit by a predetermined amount.

4. The timing adjustment circuit according to claim 1, further comprising:
   a dummy data output circuit for outputting "1010" repetition data which always changes, based on a clock for regulating a data transmitting timing of the data transmitting unit, wherein
   phase comparison unit compares a phase of a clock for regulating a data receiving timing of the data receiving unit with a phase of data outputted by the dummy data output circuit, and wherein
   the phase adjustment unit changes a phase of a clock for regulating a data transmitting timing of the data transmitting unit.

5. The timing adjustment circuit according to claim 4, wherein
   the dummy data output circuit has the same configuration of a final stage of the data transmitting unit.

6. The timing adjustment circuit according to claim 5, wherein
   the dummy data output circuit outputs "1010" repetition data which always changes in synchronization with a clock obtained by shifting a phase of a clock for regulating a data transmitting timing of the data transmitting unit by a predetermined amount.

7. An LSI in which data is sequentially transmitted/received between a plurality of blocks, comprising:
   a timing adjustment circuit for each transmitting side block and receiving side block, comprising:
   a data change detection unit for detecting a change of data outputted by a data transmitting side block;
   a phase comparison unit for comparing a phase of a clock for regulating a data receiving timing of the data receiving side block with a phase of data outputted by the data transmitting side block; and
   a phase adjustment unit for changing a phase of a clock for regulating a data transmitting timing of the data transmitting side block, according to a phase comparison result of the phase comparison unit when the data change detection unit detects a change of data outputted by the data transmitting side block.

8. The LSI according to claim 7, wherein
   the phase adjustment unit is disposed in such a way that a clock whose phase is to be adjusted between a specific data transmitting side block and a data receiving side block may affect a data transmitting/receiving timing between another data transmitting side block and a data receiving side block.

9. The LSI according to claim 7, wherein
   the phase adjustment unit is disposed in such a way that a clock whose phase is to be adjusted between a specific data transmitting side block and a data receiving side block may not affect a data transmitting/receiving timing between another data transmitting side block and a data receiving side block.

10. The LSI according to claim 7, wherein
    the plurality of blocks are a plurality of multiplexers for sequentially converting parallel data into serial data and compose a data transmitting circuit for externally outputting data from the LSI.

11. The LSI according to claim 10, wherein
    each of the multiplexers outputs data whose bit width is a half of that of input data and whose speed is double.

12. The LSI according to claim 11, wherein
a clock for regulating a data receiving timing of a final stage multiplexer of the plurality of multiplexers is generated by a clock generation means of the LSI,
a ½ frequency divider is provided for each of the transmitting side multiplexers and the receiving side multiplexers,
the multiplexers other than the final stage one is supplied with a clock obtained by dividing a clock for regulating a data receiving timing of the later stage multiplexer by the ½ frequency divider via the phase adjustment unit and a data transmitting timing to the later stage multiplexer is regulated by the supplied clock.

13. The LSI according to claim 12, wherein
the ½ frequency divider corresponding to the final stage multiplexer and its previous stage multiplexer is inputted by a clock generated by the clock generation means of the LSI, and the other ½ frequency dividers is inputted by output of the later stage ½ frequency divider.

14. The LSI according to claim 12, wherein
the ½ frequency divider corresponding to the final stage multiplexer and its previous stage multiplexer is inputted by a clock generated by the clock generation means of the LSI, and the other ½ frequency dividers is inputted by output of the later stage ½ frequency divider via the phase adjustment unit.

15. A data transmitting/receiving system for transmitting/receiving data between a first LSI and a second LSI, comprising
a timing adjustment circuit, comprising
a data change detection unit for detecting a change of data outputted by the first LSI;
a phase comparison unit for comparing a phase of a clock for regulating a data receiving timing of the second LSI with a phase of data outputted by the first LSI; and
a phase adjustment unit for changing a phase of a clock for regulating a data transmitting timing of the first LSI, according to a phase comparison result of the phase comparison unit when the data change detection unit detects a change of data outputted by the first LSI.

16. The data transmitting/receiving system according to claim 15, wherein
the first LSI comprises a data transmitting circuit including a plurality of multiplexers for sequentially converting parallel data into serial data, for externally outputting data from the first LSI.

17. The data transmitting/receiving system according to claim 16, wherein
each of the multiplexers outputs data whose bit width is a half of that of input data and whose speed is double.

18. The data transmitting/receiving system according to claim 17, comprising
a timing adjustment circuit for each transmitting side multiplexer and receiving side multiplexer, comprising:
a data change detection unit for detecting a change of data outputted by a data transmitting side multiplexer;
a phase comparison unit for comparing a clock for regulating a data receiving timing of the data receiving multiplexer with a phase of data outputted by the data transmitting side multiplexer; and
a phase adjustment unit for changing a phase of a clock for regulating a data transmitting timing of the data transmitting side multiplexer, according to a phase comparison result of the phase comparison unit when the data change detection unit detects a change of data outputted by the data transmitting side multiplexer.

* * * * *

UNITED STATES PATENT AND TRADEMARK OFFICE
CERTIFICATE OF CORRECTION

PATENT NO. : 7,653,169 B2　　　　　　　　　　　　　　　　　　　　　　Page 1 of 1
APPLICATION NO. : 11/362174
DATED : January 26, 2010
INVENTOR(S) : Yamaguchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 916 days.

Signed and Sealed this

Twenty-eighth Day of December, 2010

David J. Kappos
*Director of the United States Patent and Trademark Office*